United States Patent

Presser et al.

(10) Patent No.: US 10,175,105 B2
(45) Date of Patent: Jan. 8, 2019

(54) LASER SCANNING MICROSCOPE AND AMPLIFIER ASSEMBLY

(71) Applicant: Carl Zeiss Microscopy GmbH, Jena (DE)

(72) Inventors: Nico Presser, Jena (DE); Martin Mueller, Jena (DE)

(73) Assignee: Carl Zeiss Microscopy GmbH, Jena (DE)

( * ) Notice: Subject to any disclaimer, the term of this patent is extended or adjusted under 35 U.S.C. 154(b) by 156 days.

(21) Appl. No.: 15/212,790

(22) Filed: Jul. 18, 2016

(65) Prior Publication Data

US 2016/0327430 A1 Nov. 10, 2016

Related U.S. Application Data

(63) Continuation of application No. PCT/EP2015/050557, filed on Jan. 14, 2015.

(30) Foreign Application Priority Data

Jan. 16, 2014 (DE) .................. 10 2014 000 473

(51) Int. Cl.
| | |
|---|---|
| *H01J 40/14* | (2006.01) |
| *G01J 1/46* | (2006.01) |
| *G02B 21/00* | (2006.01) |
| *H03F 3/08* | (2006.01) |
| *H03G 5/28* | (2006.01) |
| *H03G 5/14* | (2006.01) |

(52) U.S. Cl.
CPC .............. *G01J 1/46* (2013.01); *G02B 21/008* (2013.01); *H03F 3/087* (2013.01); *H03G 5/28* (2013.01); *H03G 5/14* (2013.01)

(58) Field of Classification Search
CPC .......... G01J 1/44; G01J 1/46; G01J 2001/442; G01J 2001/4466
USPC ............... 250/234, 214 A, 214 LA, 214 AG; 330/59, 110
See application file for complete search history.

(56) References Cited

U.S. PATENT DOCUMENTS

| | | | | |
|---|---|---|---|---|
| 6,207,960 B1 * | 3/2001 | Stern | .................... | C12Q 1/6834 250/458.1 |
| 2003/0020547 A1 | 1/2003 | Feng | | |
| 2013/0293305 A1 | 11/2013 | Lee | | |

FOREIGN PATENT DOCUMENTS

DE        197 02 753 A1     7/1998

OTHER PUBLICATIONS

Translation of International Preliminary Report on Patentability dated Jul. 28, 2016 of international application PCT/EP2015/050557 on which this application is based.

(Continued)

*Primary Examiner* — Kevin Pyo
(74) *Attorney, Agent, or Firm* — Walter Ottesen, P.A.

(57) ABSTRACT

A laser scanning microscope for laser scanning a sample is provided. The laser scanning microscope includes a scanner that is operated at a predefined scanning speed and that is configured to change a direction of illumination light generated to illuminate the sample. A detector is configured to detect light that is returned from the sample and an amplifier assembly is connected to the detector and is configured to amplify a detection signal that is generated by the detector. The amplifier assembly includes an adjustable capacitor and a capacitance of the adjustable capacitor is adjusted depending on the scanning speed of the scanner.

11 Claims, 3 Drawing Sheets

(56) References Cited

OTHER PUBLICATIONS

International Search Report dated Apr. 13, 2015 of international application PCT/EP2015/050557 on which this application is based.
Padera, T. et al, Conventional and High-Speed Intravital Multiphoton Laser Scanning Microscopy of Microvasculature, Lymphatics, and Leukocyte-Endothelial Interactions, Molecular Imaging, vol. 1, No. 1, Jan. 2002, pp. 9 to 15, Massachusetts Institute of Technology.

* cited by examiner

LASER SCANNING MICROSCOPE AND AMPLIFIER ASSEMBLY

CROSS REFERENCE TO RELATED APPLICATIONS

This application is a continuation application of international patent application PCT/EP2015/050557, filed Jan. 14, 2015, and claiming priority from German application 10 2014 000 473.2, filed Jan. 16, 2014, and the entire content of both applications is incorporated herein by reference.

FIELD OF THE INVENTION

The present invention relates to a Laser Scanning Microscope (LSM), an amplifier assembly for amplifying a detection signal of a light detector of the LSM and a method for operating the LSM.

BACKGROUND OF THE INVENTION

A confocal scanning microscope has a laser module which preferably includes a plurality of laser beam sources to generate illumination light with different wavelengths. The illumination light forms an illumination beam that is coupled into a scanning device. The scanning device includes a main color splitter, an xy-scanner, a scanning lens, and a microscope lens.

The scanning device guides the illumination beam via the scanning lens and the microscope lens to a sample that is placed on a microscope stage of the confocal scanning microscope. A measurement light beam that originates from the sample is directed via the main color splitter and a projection lens onto at least one confocal detection stop (detection pinhole) of at least one detection channel.

An image of the sample may be recorded by photomultiplier tubes or photomultipliers (PMTs) and amplifiers may be arranged downstream of the PMTs. The amplifiers have a predefined constant bandwidth. The effective bandwidth of the PMTs depends on the scanning speed. Therefore, the scanning speed is set to a maximum scanning speed which results in a large bandwidth.

For low scanning speeds, however, a large bandwidth is not required and has even a negative impact on the signal-to-noise ratio (SNR), and hence on the image quality, since more noise is recorded.

SUMMARY OF THE INVENTION

It is an object of the invention to provide an amplifier assembly with a dynamically adjustable bandwidth and a method for dynamically adjusting the bandwidth of the amplifier assembly for amplifying a detection signal of a light detector of a laser scanning microscope.

The object is achieved by providing a laser scanning microscope for laser scanning a sample including: at least one scanner operating at a predefined scanning speed and being configured to change a direction of illumination light generated to illuminate the sample; at least one detector configured to detect light returned from the sample; an amplifier assembly connected to the at least one detector and configured to amplify a detection signal generated by the at least one detector; the amplifier assembly including an adjustable capacitor; and, a capacitance of the adjustable capacitor being adjustable depending on the predefined scanning speed of the at least one scanner.

According to an aspect of the invention, the dynamic bandwidth adjustment of the amplifier assembly is realized by a single component, preferably by an integrated component, so that a bandwidth of amplification can be set individually for each scanning speed.

As a result, a high portion of white noise (which is detrimental to the image quality) is prevented from being recorded as images are recorded at a low scanning speed.

According to another aspect of the invention, the amplifier assembly may act as a high-pass filter or a low-pass filter. It is advantageous to be able to variably adjust the low-pass filter as new detector amplifiers are tested.

BRIEF DESCRIPTION OF THE DRAWINGS

The invention will now be described with reference to the drawings wherein.

DESCRIPTION OF THE PREFERRED EMBODIMENTS OF THE INVENTION

Figure 1:
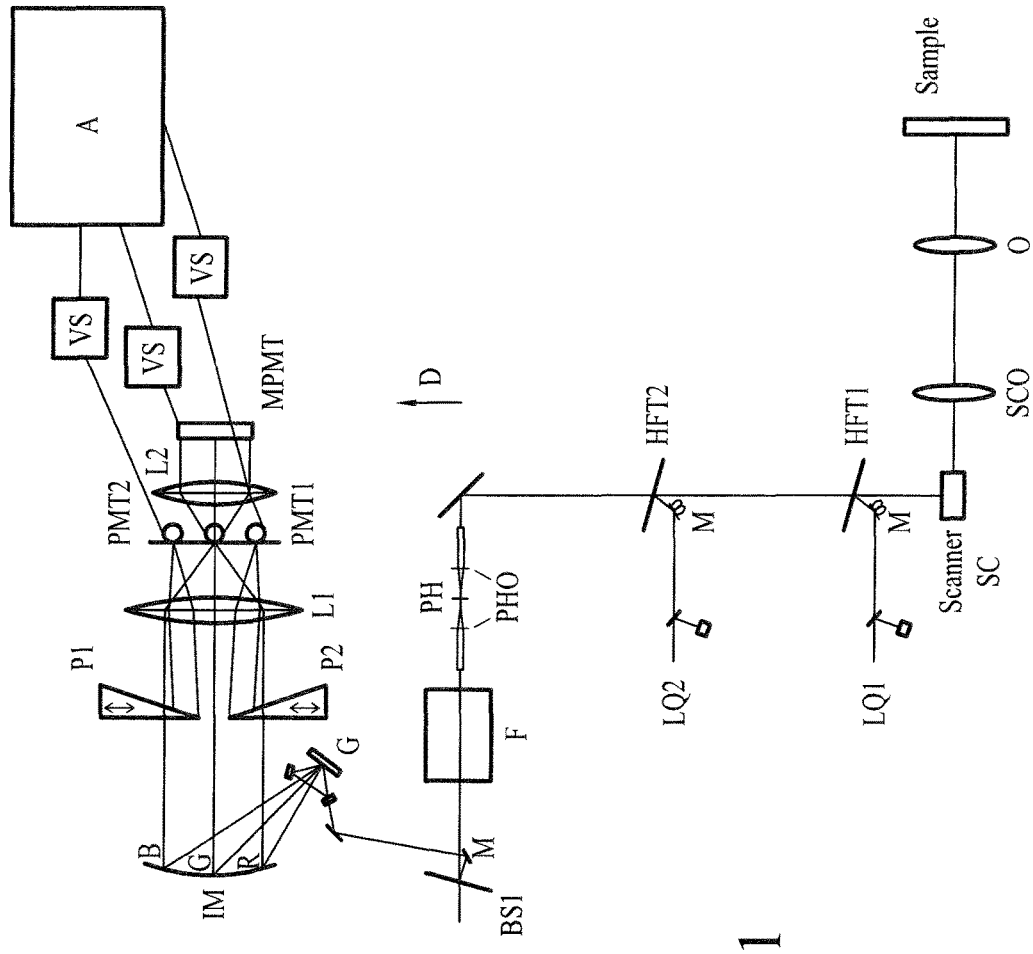
FIG. 1 is a schematic illustration of a light beam path of an LSM.

FIG. 1 shows an LSM light beam path that generally corresponds to a light beam path in the LSM 710 laser scanning microscope of ZEISS.

Additional reference is made to DE 19702753 A1 which is incorporated herein by reference and which describes in detail another LSM light beam path.

As shown in FIG. 1, light from two lasers or laser groups LQ1 and LQ2 is initially directed by main color splitters HFT1, HFT2 and scanner SC towards scanning optic SCO and microscope lens O and reaches a sample in a conventional manner. The main color splitters HFT1 and HFT2 separate the illumination beam path from the detection beam path. The main color splitters HFT1 and HFT2 may be switchable and may be implemented as dichroic filter wheels. The main color splitters HFT1 and HFT2 reflect the illumination light and may also be replaceable to flexibly select wavelengths. The scanner SC includes two independent scanning mirrors for x- and y-deflection. The two independent scanning mirrors may be galvanometric scanning mirrors. Instead of utilizing galvanometric scanning mirrors, MEMS scanners or resonance scanners may also be used.

In a return direction illustrated by arrow D, the detection light from the sample is transmitted via the main color splitters HFT1 and HFT2 toward a detector arrangement. The detection light initially passes a pinhole PH via a pinhole optical unit PHO. The PHO is arranged upstream and downstream of the pinhole PH. Subsequently, the detection light passes a filter arrangement F and reaches, via beam splitter BS1, mirror M, and further deflections, grating G that spectrally splits the detection light. The filter arrangement F is provided for narrow-bandwidth filtering of unwanted radiation components. The filter arrangement F includes, for example, notch filters. The beam splitter BS1 optionally enables decoupling of the detection light to external detection modules via a transmissive component and appropriate switching.

Divergent spectral components that are split by the grating G are collimated by an imaging mirror IM before the spectral components reach the detector arrangement. The detector arrangement includes individual photomultipliers PMT1 and PMT2 in edge regions and a centrally arranged multichannel detector MPMT.

Instead of using the centrally arranged multichannel detector MPMT, a further individual detector may also be used.

Amplifier assemblies VS are arranged downstream of the individual detectors PMT1, PMT2 and the individual channels of the multichannel detector arrangement.

A lens L1 is provided between the imaging mirror IM and the individual photomultipliers PMT1 and PMT2. Two prisms P1 and P2 are arranged upstream and in edge regions of lens L1. The two prisms P1 and P2 are displaceably arranged perpendicular to the optical axis of lens L1 and combine some of the spectral components which are focused onto the individual photmultipliers PMT1 and PMT2 by lens L1. The remaining part of the detection radiation is collimated by a second lens L2 after passing through a plane of the individual photomultipliers PMT1 and PMT2, and is directed in a spectrally separated manner onto the individual detection channels of the MPMT.

Displacement of the prisms P1 and P2 allows flexible adjustment of a first part of the sample detection light that is detected in a spectrally separated manner by the MPMT and a second part of the sample detection light that is combined by the prisms P1 and P2, and that is detected by photomultipliers PMT1 and PMT2.

Figure 2:
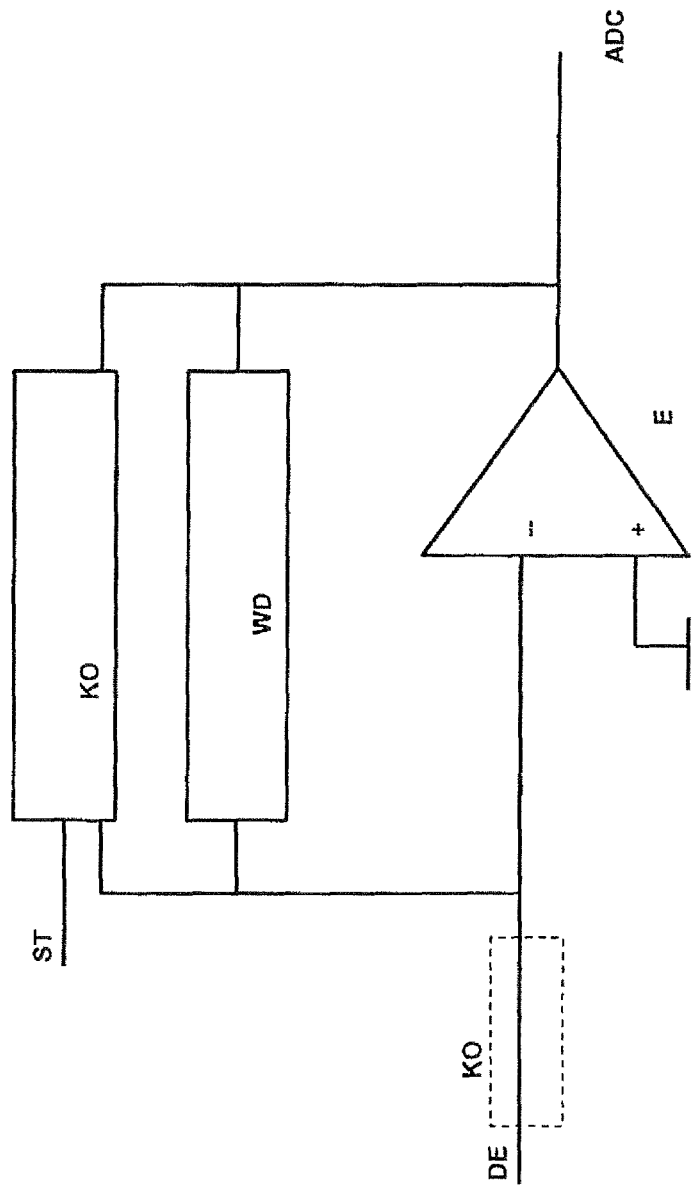
FIG. 2 is a block diagram of an amplifier circuit according to an exemplary embodiment of the present invention.

FIG. 2 shows an amplifier assembly VS arranged downstream of a detector DE, such as PMT1 and PMT2 shown in FIG. 1. In addition, an avalanche photodiode (APD) may also be used as a detector DE. The amplifier assembly includes resistor WD for amplification and an adjustable capacitor KO connected parallel to the resistor WD. The amplifier assembly VS further includes a digital or analog control input ST to control a bandwidth limit and an operational amplifier E which performs a current/voltage transformation. The amplifier assembly acts as a low-pass filter because of its parallel circuit arrangement. The higher the capacitance is set, the lower is the set bandpass filter.

The amplifier assembly VS may also act as a high-pass filter. For a high-pass filter application of the amplifier assembly VS, instead of arranging the adjustable capacitor KO parallel to the resistor WD, the adjustable capacitor is arranged downstream of the detector in series with the resistor WD, as illustrated in FIG. 2 by a dashed line.

It is also possible to provide the amplifier assembly VS with two adjustable capacitors KO (one adjustable capacitor arranged parallel to the resistor WD and another adjustable capacitor arranged in series with the resistor WD) in order to operate the amplifier assembly VS as a high-pass filter and as a low-pass filter, for example for pulse amplification.

As shown in FIG. 1, the individual amplifier assemblies VS, that are arranged downstream of the detectors, are connected to a central control or actuation unit A which controls the central microscope functions and which has a user interface, such as for example an interactive screen (not shown) in order to set user preferences.

User preferences can be set by a slider on the interactive screen, for example by a slider by which the user sets the scanning speed. The set scanning speed is then linked by a program to a value of the adjustable capacitor KO, for example by way of a lookup table, so that an appropriate capacitance value can be set via an input DI.

Figure 3:
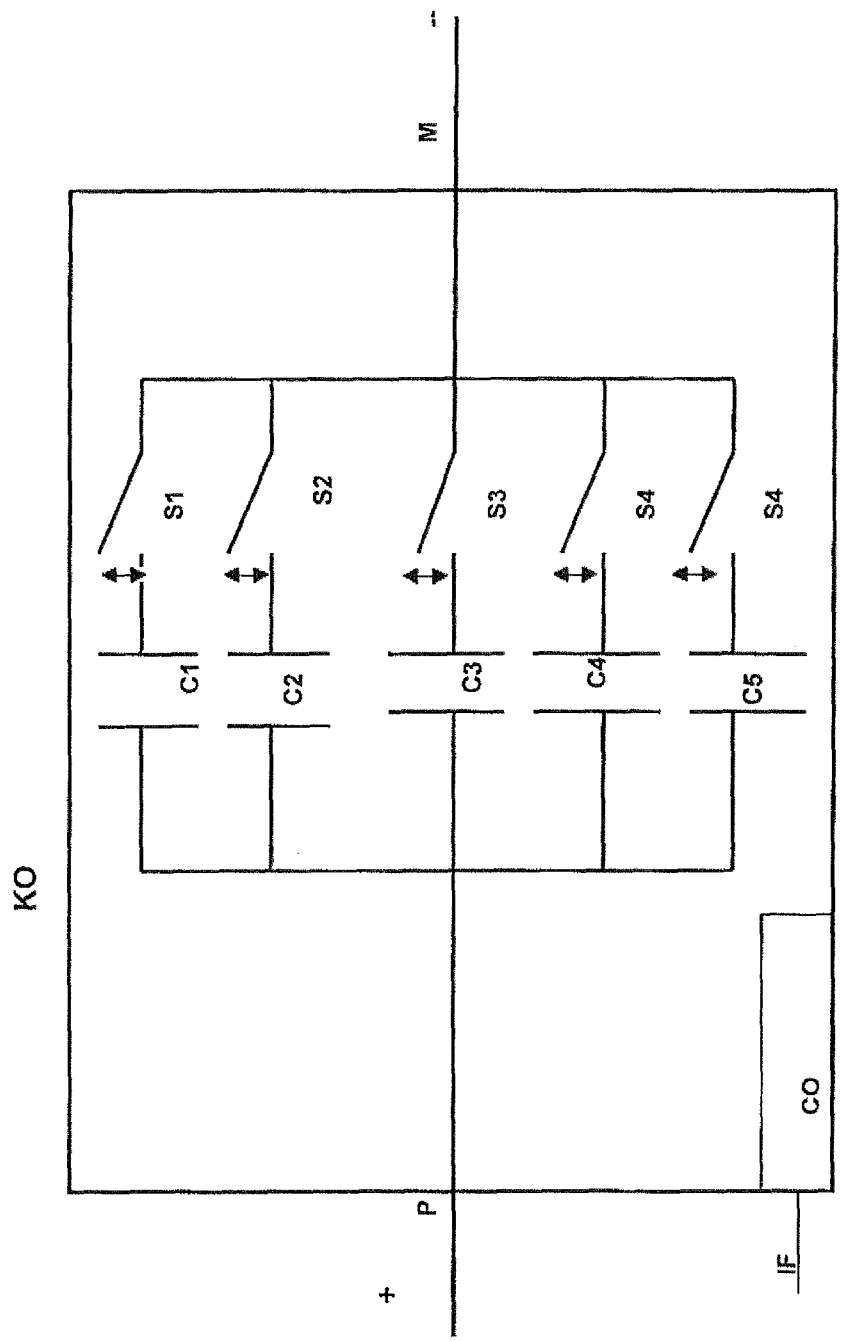
FIG. 3 is a schematic illustration of an adjustable capacitor according to an exemplary embodiment of the present invention.

FIG. 3 schematically shows an adjustable capacitor KO according to an exemplary embodiment of the invention.

The adjustable capacitor KO is controlled via interface IF by control unit CO. The control unit CO is connected to switches S1 to S5, which are individually switchable and which add or remove individually capacitors C1 to C5 between a plus input P and a minus output M. Since the capacitors C1 to C5 are connected parallel to one another, the overall capacitance is increased or decreased accordingly by operating the switches S1 to S5.

Such a component can be provided in an integrated form, similar to component PE64904, that can be obtained, for example, from the Peregrine Semiconductor Company.

The control input of the adjustable capacitor KO is connected to the central control unit A of the laser scanning microscope shown in FIG. 1.

It is understood that the foregoing description is that of the preferred embodiments of the invention and that various changes and modifications may be made thereto without departing from the spirit and scope of the invention as defined in the appended claims.

What is claimed is:

1. A laser scanning microscope for laser scanning a sample, the laser scanning microscope comprising:
    at least one scanner operating at a scanning speed and being configured to change a direction of illumination light generated to illuminate the sample;
    at least one detector configured to detect light returned from the sample;
    a control unit having a user interface for setting the scanning speed;
    a lookup table to link the scanning speed to an adjusted capacitance value of the adjustable capacitor;
    an amplifier assembly connected to said at least one detector and configured to amplify a detection signal generated by said at least one detector; and,
    said amplifier assembly including a capacitor adjustable in dependence on a set scanning speed of the at least one scanner, wherein the set scanning speed is selected from at least two different scanning speeds greater than zero.

2. The laser scanning microscope of claim 1, wherein the at least one detector is an avalanche photodiode.

3. The laser scanning microscope of claim 1, wherein the at least one detector is a photomultiplier.

4. An amplifier assembly for amplifying a detection signal generated by a detector of a laser scanning microscope, the laser scanning microscope including a scanner operated at a scanning speed, the amplifier assembly comprising:
    a capacitor adjustable in dependence on a set scanning speed of the scanner, wherein the set scanning speed is selected from at least two different scanning speeds greater than zero;
    a control unit having a user interface for setting the scanning speed; and,
    a lookup table to link the scanning speed to an adjusted capacitance value of the adjustable capacitor.

5. The amplifier assembly of claim 4, wherein the detector is an avalanche photodiode.

6. The amplifier assembly of claim 4, wherein the detector is a photomultiplier.

7. A method for operating a laser scanning microscope for laser scanning a sample, the laser scanning microscope including at least one scanner operated at a scanning speed and configured to change a direction of illumination light generated to illuminate the sample, at least one detector configured to detect light returned from the sample, an amplifier assembly connected to said at least one detector and configured to amplify a detection signal generated by said at least one detector, the amplifier assembly including a capacitor adjustable in dependence on a set scanning speed of the at least one scanner, wherein the set scanning speed is selected from at least two different scanning speeds greater than zero, a control unit having a user interface for setting the scanning speed, and a lookup table to link the scanning speed to an adjusted capacitance value of the capacitor, the method comprising:

amplifying the detection signal of the at least one detector of the laser scanning microscope; and, adjusting a capacitance of the adjustable capacitor during amplification so as to cause the amplifier assembly to operate as at least one of a highpass filter and a lowpass filter.

8. The method of claim 7, further comprising:
adjusting the capacitance of the adjustable capacitor so that the amplifier assembly operates as the lowpass filter to adapt the amplifier assembly to the scanning speed of the at least one scanner.

9. The method of claim 7, further comprising:
adjusting the capacitance of the adjustable capacitor so that the amplifier assembly operates as the highpass filter for pulse amplification.

10. The method of claim 7, further comprising:
adjusting the capacitance of the adjustable capacitor via an analog interface or a digital interface.

11. The method of claim 7, further comprising:
linking the scanning speed with the capacitance of the adjustable capacitor via the lookup table.

\* \* \* \* \*